United States Patent
Hojo

(10) Patent No.: US 11,125,776 B2
(45) Date of Patent: Sep. 21, 2021

(54) SHORT CIRCUIT INSPECTION METHOD FOR ALL-SOLID-STATE BATTERY ASSEMBLY, RESTRAINT JIG USED THEREFOR, KIT FOR SHORT CIRCUIT INSPECTION, AND METHOD FOR MANUFACTURING ALL-SOLID-STATE BATTERY

(71) Applicant: TOYOTA JIDOSHA KABUSHIKI KAISHA, Toyota (JP)

(72) Inventor: Takayuki Hojo, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/446,850

(22) Filed: Jun. 20, 2019

(65) Prior Publication Data

US 2020/0011894 A1 Jan. 9, 2020

(30) Foreign Application Priority Data

Jul. 6, 2018 (JP) .............................. JP2018-129452
Apr. 12, 2019 (JP) .............................. JP2019-076561

(51) Int. Cl.
*G01R 1/04* (2006.01)
*H01M 10/42* (2006.01)
(Continued)

(52) U.S. Cl.
CPC ....... *G01R 1/0408* (2013.01); *G01R 31/3644* (2013.01); *G01R 31/385* (2019.01); *G01R 31/50* (2020.01); *H01M 10/4285* (2013.01)

(58) Field of Classification Search
CPC .... G01R 1/0408; G01R 31/385; G01R 31/50; G01R 31/3644; H01M 10/4285
See application file for complete search history.

(56) References Cited

U.S. PATENT DOCUMENTS

2012/0183823 A1* 7/2012 Von Borck .......... H01M 10/441
429/81
2015/0180076 A1 6/2015 Hasegawa et al.
(Continued)

FOREIGN PATENT DOCUMENTS

CN 104733769 A 6/2015
JP 2000-028690 A 1/2000
(Continued)

OTHER PUBLICATIONS

Xu et al., "State of Charge Dependent Mechanical Integrity Behavior of 18650 Lithium-ion Batteries", 2016, Scientific reports (Year: 2016).*

(Continued)

*Primary Examiner* — Tung X Nguyen
*Assistant Examiner* — Feba Pothen
(74) *Attorney, Agent, or Firm* — Oliff PLC

(57) ABSTRACT

According to one aspect of the present invention, a short circuit inspection method for an all solid battery assembly is provided which includes: a step of preparing an all-solid-state battery assembly; a step of preparing a restraint jig including a pair of restraint plates sandwiching the all-solid-state battery assembly in the thickness direction, and a restraint member including a bolt and a nut, wherein where a smallest thermal expansion coefficient among the thermal expansion coefficient of the positive electrode current collector and the thermal expansion coefficient of the negative electrode current collector of the all-solid-state battery assembly is denoted by α1, the thermal expansion coefficients of the bolt and the nut are each equal to or greater than α1; a step of restraining the all-solid-state battery assembly; a step of increasing the resistance of the all-solid-state battery assembly by cooling; a step of applying a voltage to the all-solid-state battery assembly and measuring a current;

(Continued)

and a step of determining whether or not a short circuit has occurred in the all-solid-state battery assembly on the basis of the measured current value.

5 Claims, 5 Drawing Sheets

(51) Int. Cl.
*G01R 31/385* (2019.01)
*G01R 31/36* (2020.01)
*G01R 31/50* (2020.01)

(56) References Cited

U.S. PATENT DOCUMENTS

2016/0064972 A1* 3/2016 Stefanopoulou ..... G01R 31/387
320/116
2016/0133982 A1 5/2016 Takeyama

FOREIGN PATENT DOCUMENTS

| | | |
|---|---|---|
| JP | 2001-110458 A | 4/2001 |
| JP | 2008-103284 A | 5/2008 |
| JP | 2013145175 A | 7/2013 |
| JP | 2018-022564 A | 2/2018 |
| KR | 10-2016-0054412 A | 5/2016 |

OTHER PUBLICATIONS

U.S. Appl. No. 16/287,086, filed Feb. 27, 2019 in the name of Masato Kamiya at el.

* cited by examiner

SHORT CIRCUIT INSPECTION METHOD FOR ALL-SOLID-STATE BATTERY ASSEMBLY, RESTRAINT JIG USED THEREFOR, KIT FOR SHORT CIRCUIT INSPECTION, AND METHOD FOR MANUFACTURING ALL-SOLID-STATE BATTERY

CROSS REFERENCE TO RELATED APPLICATIONS

This application claims the benefit of priority to Japanese Patent Applications No. 2018-129452 filed on Jul. 6, 2018 and Japanese Patent Application No. 2019-076561 filed on Apr. 12, 2019. The entire contents of these applications are hereby incorporated herein by reference.

BACKGROUND OF THE DISCLOSURE

1. Field

The present invention relates to a short circuit inspection method for an all-solid-state battery assembly, a restraint jig used therefor, a kit for short circuit inspection, and a method for manufacturing an all-solid-state battery.

2. Background

In general, in a battery manufacturing process, pre-shipment inspection is performed on the constructed battery assembly in order to provide a battery of stable quality. Prior art documents related to such inspection can be exemplified by Japanese Patent Application Publication No. 2001-110458 and Japanese Patent Application Publication No. 2018-022564. For example, Japanese Patent Application Publication No. 2001-110458 discloses a short circuit inspection method for a battery assembly of a liquid system. In this short circuit inspection method, first, a battery assembly in a state before injection of a non-aqueous electrolyte is prepared, the battery assembly including an electrode assembly in which a positive electrode, a separator and a negative electrode are stacked in this order. Next, a high voltage is applied to the battery assembly, and the current value at this time is measured. Then, based on the measured current value, it is determined whether or not a short circuit has occurred between the positive electrode and the negative electrode (presence or absence of a short circuit).

SUMMARY

Incidentally, in recent years, while improvement in battery reliability and cost reduction are required, development of an all-solid-state battery having a positive electrode, a negative electrode, and a solid electrolyte layer interposed between the positive electrode and the negative electrode has accelerated. In the manufacture of an all-solid-state battery, in an all-solid-state battery assembly in a state before the initial charging, a positive electrode, a negative electrode and a solid electrolyte layer are usually already integrated. For this reason, it is difficult to use directly the above-described short-circuit inspection method of a battery assembly of a liquid system. That is, when a high voltage as described in Japanese Patent Application Publication No. 2001-110458 is applied to the all-solid-state battery assembly, a charge reaction occurs and functions as a battery. Therefore, the difference in presence or absence of a short circuit is unlikely to appear in the current value at the time of voltage application.

The present invention has been accomplished with the foregoing in view, and it is an object of the present invention to provide an inspection method for inspecting the presence or absence of a short circuit in an all-solid-state battery assembly with high accuracy. Also, another related object is to provide a restraint jig and a kit for short circuit inspection to be used in inspecting a short circuit of an all-solid-state battery assembly. Another related object is to provide a method for manufacturing an all-solid-state battery.

The inventors of the present invention initially considered increasing the resistance of the solid electrolyte layer and creating the same conditions as those relating to a battery assembly of a liquid system by lowering the temperature of the all-solid-state battery. That is, a short circuit inspection method was considered that included the following steps: a restraining step of restraining an all-solid-state battery assembly in a thickness direction with a restraint jig; a resistance increase step of increasing the resistance of the all-solid-state battery assembly by cooling the restrained all-solid-state battery assembly; a voltage application step of applying a voltage to the all-solid-state battery assembly having increased resistance and measuring a current value at the time of voltage application; and a determination step of determining whether or not a short circuit has occurred in the all-solid-state battery assembly on the basis of the measured current value.

However, according to the study conducted by the inventors, where the all-solid-state is cooled, the assembly shrinks and becomes thinner. As a result, it has been found that the force of the restraint jig for restraining the all-solid-state battery assembly is weakened and the detection sensitivity at the time of the short circuit inspection is lowered. Therefore, the inventors accomplished the art disclosed herein after further intensive studies.

According to one aspect of the art disclosed herein, a short circuit inspection method for an all solid battery assembly is provided. This short circuit inspection method includes the following steps: an assembly preparation step of preparing an all-solid-state battery assembly including a positive electrode including a positive electrode current collector and a positive electrode composite material layer disposed on the positive electrode current collector, a negative electrode including a negative electrode current collector and a negative electrode composite material layer disposed on the negative electrode current collector, and a solid electrolyte layer interposed between the positive electrode composite material layer and the negative electrode composite material layer in a thickness direction; a jig preparation step of preparing a restraint jig including a pair of restraint plates having a bolt insertion hole and sandwiching the all-solid-state battery assembly in the thickness direction, and a restraint member that includes a bolt to be inserted into the bolt insertion hole and a nut to be screwed to the bolt and applies a load to the all-solid-state battery assembly from the thickness direction, wherein when a smallest thermal expansion coefficient among the thermal expansion coefficient of the positive electrode current collector and the thermal expansion coefficient of the negative electrode current collector of the all-solid-state battery assembly is denoted by $\alpha 1$, the thermal expansion coefficients of the bolt and the nut are each equal to or greater than $\alpha 1$; a restraining step of disposing the all-solid-state battery assembly between the pair of restraint plates of the restraint jig and restraining the all-solid-state battery assembly with the restraint jig; a resistance increase step of increasing the resistance of the all-solid-state battery assembly by cooling the all-solid-state battery assembly after the restraining step; a voltage application step of applying a voltage to the all-solid-state battery assembly after the resistance increase step and measuring a current value at the time of voltage application; and a determination step of determining whether or not a short circuit has occurred in the all-solid-state battery assembly by comparing the measured current value with a predetermined threshold after the voltage application step.

In the short circuit inspection method, the presence or absence of a short circuit can be inspected by a relatively simple method of applying a voltage after restraining and cooling the all-solid-state battery assembly. Further, by using a restraint jig that satisfies the above thermal expansion coefficient, it is possible to buffer contraction of the all-solid-state battery assembly at the time of cooling, and to restrain the all-solid-state battery assembly with a stable force. As a result, the detection sensitivity at the time of the short circuit inspection of the all-solid-state battery assembly is stable, and the inspection can be performed with high accuracy. For example, as compared with the case of using a restraint jig which does not satisfy the thermal expansion coefficient, even the presence of finer conductive foreign matter can be detected.

In the present specification, "thermal expansion coefficient" refers to an average coefficient of linear expansion measured with a general thermomechanical analysis apparatus (TMA) in a temperature range from 0° C. to 100° C. under an atmosphere pressure (1 atm) environment. That is, it is assumed that thermal expansion coefficient indicates a value obtained by dividing the amount of change in the length of a sample with respect to the initial length of the sample by the temperature difference. The measurement of the thermal expansion coefficient can be performed, for example, according to JIS Z 2285:2003 (Methods for Measuring Coefficient of Linear Expansion of Metal Materials).

Further, in the present specification, "short circuit inspection" is inclusive of not only an inspection for detecting the so-called complete short circuit in which a current flows between a positive electrode and a negative electrode, but also, for example, an inspection for detecting a slight short circuit, and inspection for detecting the admixture of conductive foreign matter, and the like. Further, the inspection for detecting the admixture of conductive foreign matter includes, for example, an inspection for detecting conductive foreign matter penetrating the solid electrolyte layer, an inspection for detecting conductive foreign matter not penetrating the solid electrolyte layer, an inspection for detecting conductive foreign matter included in the solid electrolyte layer, an inspection for detecting conductive foreign matter included between the solid electrolyte layer and the positive electrode composite material layer, an inspection for detecting conductive foreign matter included between the solid electrolyte layer and the negative electrode composite material layer, and the like.

In one embodiment of the art disclosed herein, the restraint plate, the bolt, and the nut are made of the same type of metal material. As a result, the thermal expansion coefficients between the respective elements of the restraint jig can be matched, and the effects of the art disclosed herein can be exhibited at a higher level.

In the present specification, "the same type of metal" means metal of the same composition or mostly the same composition which has substantially the same thermal expansion coefficient (approximately within $\pm 0.5 \times 10^{-6}/°$ C., for example within $\pm 0.3 \times 10^{-6}/°$ C.). The metal may be, for example, an alloy or the like. Further, the surface of the metal may be subjected to processing such as coating or the like. In this case, the constituent metals of the base material excluding the processed portion may be of the same type.

In one embodiment of the art disclosed herein, at least a part of the restraint jig is brought into contact with a refrigerant from the resistance increase step to the voltage application step to maintain the all-solid-state battery assembly in a cooled state. As a result, the cooled state of the all-solid-state battery assembly can be stably maintained, and inspection with less error can be performed.

In one embodiment of the art disclosed herein, in the jig preparation step, the restraint jig in which the thermal expansion coefficients of the bolt and the nut are each $16.5 \times 10^{-6}/°$ C. or more is prepared. By setting the thermal expansion coefficients of the bolt and the nut to a predetermined value or more, the effects of the art disclosed herein can be exhibited at a higher level.

According to another aspect of the art disclosed herein, a restraint jig is provided which is to be used in short circuit inspection by applying a voltage to an all-solid-state battery assembly and configured to restrain the all-solid-state battery assembly in a thickness direction in a state of cooling the all-solid-state battery assembly including a positive electrode including a positive electrode current collector and a positive electrode composite material layer disposed on the positive electrode current collector, a negative electrode including a negative electrode current collector and a negative electrode composite material layer disposed on the negative electrode current collector, and a solid electrolyte layer interposed between the positive electrode composite material layer and the negative electrode composite material layer in the thickness direction. The restraint jig includes a pair of restraint plates having a bolt insertion hole and sandwiching the all-solid-state battery assembly in the thickness direction; and a restraint member that includes a bolt to be inserted into the bolt insertion hole and a nut to be screwed to the bolt and applies a load to the all-solid-state battery assembly from the thickness direction, wherein when a smallest thermal expansion coefficient among the thermal expansion coefficient of the positive electrode current collector and the thermal expansion coefficient of the negative electrode current collector of the all-solid-state battery assembly is denoted by $\alpha 1$, the thermal expansion coefficients of the bolt and the nut are each equal to or greater than $\alpha 1$.

The above-mentioned restraint jig is cooled, for example, from room temperature to cryogenic temperature, and can stably restrain the all-solid-state battery assembly even in a cooled state. Therefore, the restraint jig can be used suitably at the time of the short circuit inspection performed in the state where the all-solid-state battery assembly is cooled.

In one embodiment of the art disclosed herein, the restraint plate, the bolt, and the nut are made of the same type of metal material. As a result, the thermal expansion coefficients between the respective elements of the restraint jig can be matched, and the effects of the art disclosed herein can be exhibited at a higher level.

In one embodiment of the art disclosed herein, the thermal expansion coefficients of the bolt and the nut are each $16.5 \times 10^{-6}/°$ C. or more. By setting the thermal expansion coefficients of the bolt and the nut to a predetermined value or more, the effects of the art disclosed herein can be exhibited at a higher level.

Further, according to another aspect of the art disclosed herein, a kit for short circuit inspection is provided, the kit comprising the restraint jig; and a container for accommodating the restraint jig in a state of restraining the all-solid-state battery assembly together with a refrigerant. As a result, the cooled state of the all-solid-state battery assembly can be stably maintained, and inspection with less error can be performed.

Furthermore, according to another aspect of the art disclosed herein, a method for manufacturing an all-solid-state battery, comprising the short circuit inspection method is provided. As a result, it is possible to manufacture and supply to the market an all-solid-state battery with further improved quality stability (in other words, smaller variation in performance).

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
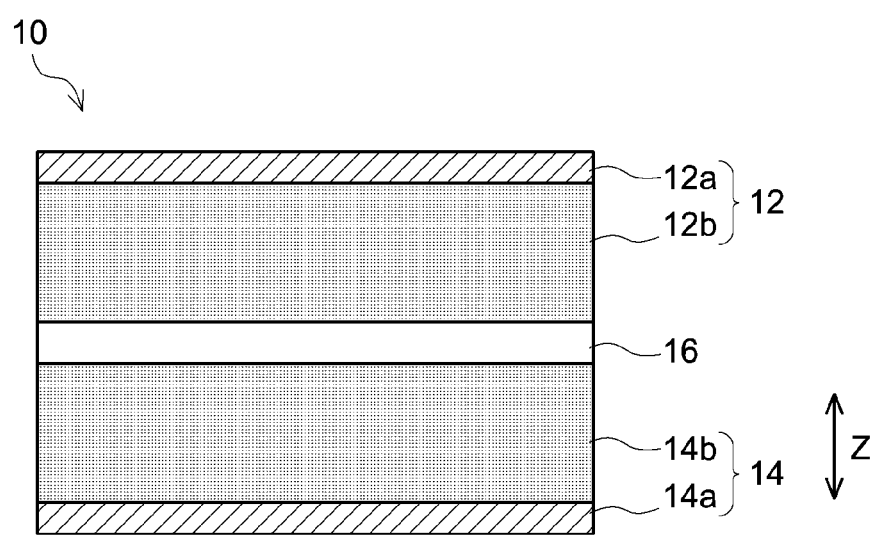
FIG. 1 is a schematic cross-sectional view showing the structure of an all-solid-state battery assembly.

Hereinafter, an embodiment of the art disclosed herein will be described. The embodiments described herein are, of course, not intended to limit the art disclosed herein. Matters other than the matters specifically mentioned in the present specification and necessary for the implementation of the art disclosed herein can be understood as design matters for a person skilled in the art based on the related art in the pertinent field. The art disclosed herein can be implemented based on the contents disclosed herein and common technical knowledge in the field. Further, in the present specification, when a numerical range is described as A to B (here, A and B are arbitrary numerical values), it means A or more and B or less.

Further, in the following drawings, the same reference numerals will be given to members/parts that exert the same action, and redundant descriptions may be omitted or simplified. Moreover, the reference symbol Z in a drawing is assumed to mean the thickness direction (stacking direction) of an all-solid-state battery assembly. Further, reference symbols X and Y in the drawings are assumed to mean directions orthogonal to the thickness direction Z. However, these are the directions for convenience of description, and do not limit the installation form of the all-solid-state battery assembly and the like.

Inspection Object (All-Solid-State Battery Assembly)

First, an inspection object to which the short circuit inspection method of the present embodiment is applied will be described. FIG. 1 is a schematic cross-sectional view showing the structure of an all-solid-state battery assembly 10 according to an embodiment. The all-solid-state battery assembly 10 is typically an assembly of a rechargeable secondary battery, such as a lithium ion secondary battery, a lithium ion capacitor, an electric double layer capacitor, and the like. The all-solid-state battery assembly 10 of the present embodiment includes a positive electrode 12, a negative electrode 14, and a solid electrolyte layer 16. The positive electrode 12, the negative electrode 14, and the solid electrolyte layer 16 may be accommodated in a battery case (not shown). The battery case may be made of, for example, an aluminum laminate. In the cross sectional view of FIG. 1, the solid electrolyte layer 16 is disposed between the positive electrode 12 and the negative electrode 14. The positive electrode 12 and the solid electrolyte layer 16 are interface-bonded. The negative electrode 14 and the solid electrolyte layer 16 are interface-bonded. As a result, the positive electrode 12, the negative electrode 14, and the solid electrolyte layer 16 are physically integrated. Hereinafter, each component will be described in order.

The positive electrode 12 includes a positive electrode current collector 12a and a positive electrode composite material layer 12b fixedly attached to one surface of the positive electrode current collector 12a. However, the positive electrode composite material layer 12b may be fixedly attached to both surfaces of the positive electrode current collector 12a. The positive electrode current collector 12a is a conductive member. The positive electrode current collector 12a is electrically connected to a positive electrode terminal 12t (see FIG. 2) for external connection. Electrical processing of the all-solid-state battery assembly 10 is performed via the positive electrode terminal 12t.

Although not particularly limited, for example, the positive electrode current collector 12a is made of a metal having good conductivity such as Al, Ti, Cr, Fe, Ni, Cu, Pt, Au, stainless steel (SUS), and the like. The positive electrode current collector 12a may be made of a metal including Al, for example, made of aluminum or an aluminum alloy including aluminum. The positive electrode current collector 12a may be made of, for example, Fe-, Cr-, Ni-containing austenitic stainless steel, Fe-, Cr-containing ferritic stainless steel, Fe-, Cr-containing martensitic stainless steel, or the like. The thermal expansion coefficient of the positive electrode current collector 12a may be smaller than that of a negative electrode current collector 14a, may be the same as that of the negative electrode current collector 14a, or may be larger than that of the negative electrode current collector 14a. The thermal expansion coefficient of the positive electrode current collector 12a may be, for example, $17.3 \times 10^{-6}/°$C. or more and $23.9 \times 10^{-6}/°$C. or more. The thickness of the positive electrode current collector 12a is typically less than the thickness of each of restraint plates 22a, 22b (see FIG. 2) of a restraint jig 20 (see FIG. 2) described later, and is about 50 μm or less, and may be, for example, 5 μm to 20 μm.

The positive electrode composite material layer 12b includes at least a positive electrode active material. The positive electrode active material is capable of reversibly occluding and releasing charge carriers (for example, lithium ions). Although not particularly limited, examples of the positive electrode active material include metal oxides including one or two or more metal elements and an oxygen element. The metal oxide may be a compound including a lithium element, one or two or more transition metal elements, and an oxygen element. The preferred examples of the metal oxide include lithium transition metal complex oxides such as a complex oxide including lithium and nickel, a complex oxide including lithium and cobalt, a complex oxide including lithium, nickel and cobalt, a complex oxide including lithium and manganese, a complex oxide including lithium, nickel, cobalt, and manganese, and the like.

The positive electrode composite material layer 12b may optionally include other components such as a solid electrolyte material, a binder, a conductive material, various additives, and the like, in addition to the positive electrode active material. The solid electrolyte material can be exemplified by a sulfide solid electrolyte material, an oxide solid electrolyte material, a nitride solid electrolyte material, a halide solid electrolyte material, and the like. The binder can be exemplified by a halogenated vinyl resin such as polyvinylidene fluoride (PVdF), a copolymer of polyvinylidene fluoride and hexafluoropropylene (PVdF-HFP), and the like, and a rubber such as a butadiene rubber (SBR), an acrylate butadiene rubber (ABR), a styrene-butadiene rubber (SBR), an acrylonitrile-butadiene rubber (NBR), and the like. Examples of the conductive material include carbon materials such as vapor-grown carbon fiber and carbon black.

The negative electrode 14 includes a negative electrode current collector 14a and a negative electrode composite material layer 14b fixedly attached to one surface of the negative electrode current collector 14a. However, the negative electrode composite material layer 14b may be fixedly attached to both surfaces of the negative electrode current collector 14a. The negative electrode current collector 14a is a conductive member. The negative electrode current collector 14a is electrically connected to a negative electrode terminal 14t (see FIG. 2) for external connection. Electrical processing of the all-solid-state battery assembly 10 is performed via the negative electrode terminal 14t.

Although not particularly limited, for example, the negative electrode current collector 14a is made of a metal having good conductivity such as Cu, Al, Ti, Cr, Fe, Ni, Pt, Au, stainless steel (SUS), and the like. The material of the negative electrode current collector 14a may be the same as or different from that of the positive electrode current collector 12a. The negative electrode current collector 14a may be made of a metal including Cu, for example, made of copper or a copper alloy including copper. The negative electrode current collector 14a may be made of, for example, Fe-, Cr-, Ni-containing austenitic stainless steel, Fe-, Cr-containing ferritic stainless steel, Fe-, Cr-containing martensitic stainless steel, or the like. The thermal expansion coefficient of the negative electrode current collector 14a may be smaller than that of the positive electrode current collector 12a, may be the same as that of the positive electrode current collector 12a, or may be larger than that of the positive electrode current collector 12a. The thermal expansion coefficient of the negative electrode current collector 14a may be, for example, $16.5 \times 10^{-6}/°$ C. or more and $17.3 \times 10^{-6}/°$ C. The thickness of the negative electrode current collector 14a is typically less than the thickness of each of restraint plates 22a, 22b of the restraint jig 20 described later, and may be about 50 μm or less, for example, 5 μm to 20 μm.

The negative electrode composite material layer 14b includes at least a negative electrode active material. The negative electrode active material is capable of reversibly occluding and releasing charge carriers (for example, lithium ions). Although not particularly limited, the negative electrode active material can be exemplified by a carbon material such as hard carbon, graphite, boron-added carbon, and the like, a metal material such as Al, Si, Ti, In, Sn, a metal compound including the abovementioned metal, a metal oxide, a Li metal compound, a Li metal oxide and the like.

The negative electrode composite material layer 14b may optionally include other components such as a solid electrolyte material, a binder, a conductive material, various additives, and the like, in addition to the negative electrode active material. As these components, one or two or more types of the materials exemplified as being suitable for the positive electrode composite material layer 12b may be included as appropriate.

The solid electrolyte layer 16 is disposed between the positive electrode composite material layer 12b and the negative electrode composite material layer 14b and insulates the positive electrode 12 from the negative electrode 14. The solid electrolyte layer 16 is an insulator. The solid electrolyte layer 16 has ion conductivity. When the all-solid-state battery assembly 10 is a lithium ion secondary battery, the solid electrolyte layer 16 has Li ion conductivity. In the thickness direction Z, the solid electrolyte layer 16 is typically thinner than the positive electrode composite material layer 12b and the negative electrode composite material layer 14b. The solid electrolyte layer 16 may be thinner than the positive electrode current collector 12a and/or the negative electrode current collector 14a, or may have the same thickness as the positive electrode current collector 12a and/or the negative electrode current collector 14a, or may be thicker than the current collector 12a and/or the negative electrode current collector 14a. The thickness of the solid electrolyte layer 16 is typically less than the thickness of each of the restraint plates 22a, 22b of the restraint jig 20 described later, and is about 0.1 μm to 300 μm, typically 1 μm to 50 μm, and also may be 30 μm or less, for example, 10 μm or less. The solid electrolyte layer 16 is solid at room temperature (25° C.).

The solid electrolyte layer 16 includes at least a solid electrolyte material. The solid electrolyte material may be glassy (noncrystalline), crystallized glassy, or crystalline. Examples of the solid electrolyte material include a sulfide solid electrolyte material, an oxide solid electrolyte material, a nitride solid electrolyte material, and a halide solid electrolyte material. The sulfide solid electrolyte material can be exemplified by a sulfide material such as a $Li_2S$—$P_2S_5$-based material, a $Li_2S$—$GeS_2$-based material, a $Li_2S$—$GeS_2$—$P_2S_5$-based material, a $Li_2S$—$SiS_2$-based material, a $Li_2S$—$B_2S_3$-based material, a $Li_3PO_4$—$P_2S_5$-based material, and the like. In addition, a halogen-added sulfide material in which a halogen element is added to the abovementioned sulfide material is also suitable. The oxide solid electrolyte material can be exemplified by a lithium-lanthanum-zirconium-containing composite oxide (LLZO), an Al-doped-LLZO, a lithium-lanthanum-titanium-containing composite oxide (LLTO), an Al-doped-LLTO, lithium phosphate oxynitride (LIPON) and the like.

The solid electrolyte layer 16 may include a sulfide solid electrolyte material having high ion conductivity as the solid electrolyte material. The solid electrolyte layer 16 may optionally include other components, for example, a binder, various additives, and the like, in addition to the solid electrolyte material. As these components, one or two or more types of the materials exemplified as being suitable for the positive electrode composite material layer 12b may be included as appropriate.

The positive electrode current collector 12a and the negative electrode current collector 14a are typically made of a metal, and may be members having a relatively large thermal expansion coefficient among the members constituting the all-solid-state battery assembly 10, for example, the positive electrode current collector 12a, the positive electrode composite material layer 12b, the negative electrode current collector 14a, the negative electrode composite material layer 14b, and the solid electrolyte layer 16. For this reason, the degree of contraction when the all-solid-state battery assembly 10 is cooled can be relatively largely influenced by the thermal expansion coefficient of the positive electrode current collector 12a and/or the negative electrode current collector 14a. Furthermore, the thermal expansion coefficients of the positive electrode current collector 12a and the negative electrode current collector 14a can be dominant.

Kit for Short Circuit Inspection

Figure 2:
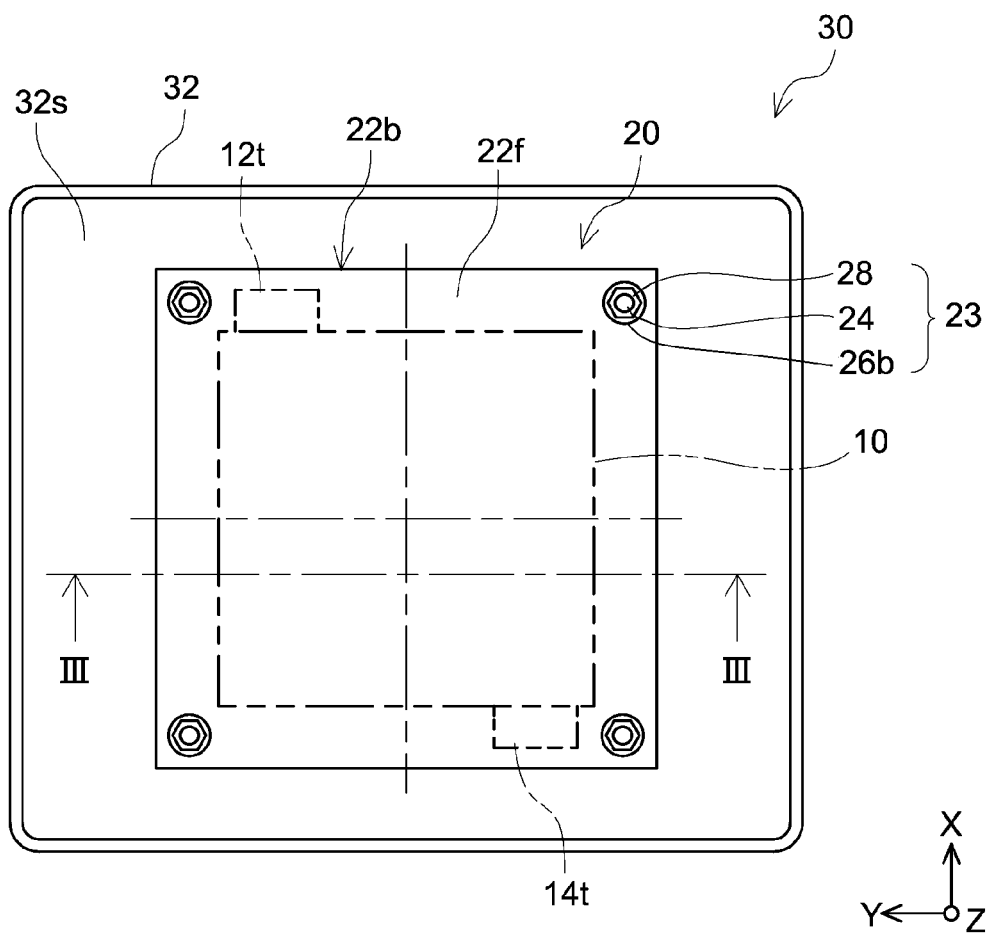
FIG. 2 is a schematic plan view of a kit for short circuit inspection according to one embodiment.

Next, a kit to be used in the short circuit inspection method of the present embodiment will be described. FIG. 2 is a schematic plan view of a kit 30 for short circuit inspection according to an embodiment. The kit 30 for short circuit inspection includes a restraint jig 20 and a container 32. The container 32 has an accommodation space 32s larger than the volume of the restraint jig 20. At the time of short circuit inspection, the restraint jig 20 in a state of restraining the all-solid-state battery assembly 10 is accommodated in the accommodation space 32s. Further, the accommodation space 32s is filled with a refrigerant (not shown) for cooling the all-solid-state battery assembly 10. For this reason, it is preferable that at least the surface of the accommodation space 32s have durability against the refrigerant. Further, the container 32 may be made of a heat insulating material having high heat retention property. The container 32 may be made of, for example, a foamed resin material such as styrene foam (Styrofoam), polyurethane foam, phenol foam or the like, or inorganic fiber such as glass wool and the like.

Figure 3:
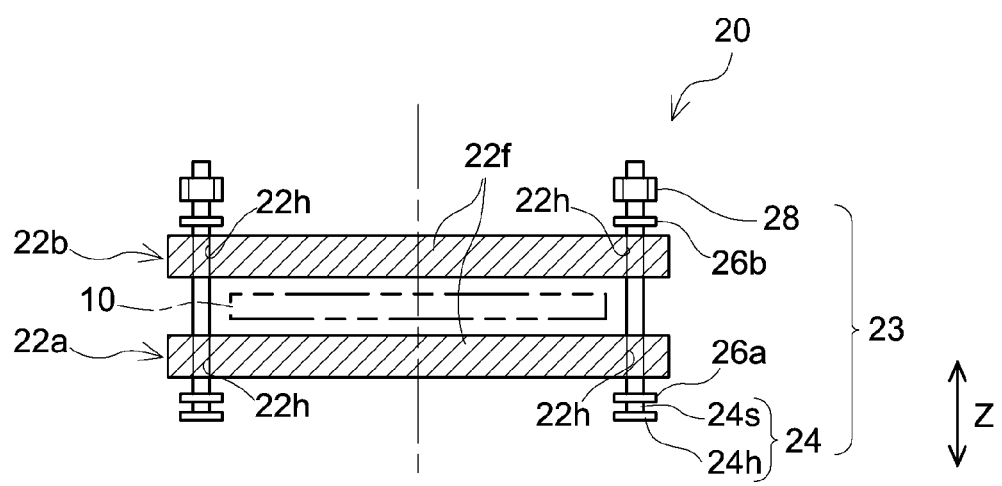
FIG. 3 is a cross-sectional view of the restraint jig shown in FIG. 2, the view being taken along a line III-III.

FIG. 3 is a cross-sectional view of the restraint jig 20 taken along a line III-III. The restraint jig 20 includes a pair of restraint plates 22a, 22b and a restraint member 23. Here, the restraint jig 20 is configured of the restraint plates 22a, 22b and the restraint member 23. However, another member (for example, a biasing spring for biasing the restraint plates 22a, 22b in the thickness direction Z) may be further provided. The restraint jig 20 is configured to restrain the restraint plates 22a, 22b from the thickness direction Z with the restraint member 23. The restraint jig 20 is configured to fix the position of the all-solid-state battery assembly 10 in the thickness direction Z. The restraint jig 20 presses the all-solid-state battery assembly 10 in the thickness direction Z such that the distance between the positive electrode 12, the solid electrolyte layer 16, and the negative electrode 14 is decreased. The restraint jig 20 is configured to apply a predetermined restraining force (restraining load) to the all-solid-state battery assembly 10.

The restraint plates 22a, 22b are configured to be capable of sandwiching the all-solid-state battery assembly 10 in the thickness direction Z. The restraint plates 22a, 22b are disposed in parallel to each other in the thickness direction Z. At the time of short circuit inspection, the restraint plates 22a, 22b are respectively disposed above and below the all-solid-state battery assembly 10 in the thickness direction Z. The restraint plates 22a, 22b are configured to sandwich and press the all-solid-state battery assembly 10 in the thickness direction. In a plan view, the restraint plates 22a, 22b have a rectangular shape. In a cross-sectional view, the restraint plates 22a, 22b are flat plates having flat surfaces. The thickness of each of the restraint plates 22a, 22b may be about 50 mm or less, for example, 5 mm to 30 mm, or 10 mm to 20 mm. Here, the restraint plates 22a, 22b are made of a metal. However, the restraint plates 22a, 22b may be made of an organic material such as a resin or an inorganic material such as a ceramic. The materials of the restraint plates 22a, 22b may be the same or different.

Here, the restraint plates 22a, 22b have the same shape. The restraint plates 22a, 22b each include a plate-shaped portion 22f and a plurality of bolt insertion holes 22h. The plate-shaped portion 22f is an area in which the all-solid-state battery assembly 10 is disposed. The plate-shaped portion 22f is in the form of a flat plate having a flat surface. Here, the XY plane of the plate-shaped portion 22f is larger than the XY plane of the all-solid-state battery assembly 10. This makes it possible to apply a uniform restraining load from the thickness direction Z to the all-solid-state battery assembly 10. Here, the XY plane of the plate-shaped portion 22f is rectangular. However, the XY plane of the plate-shaped portion 22f may have, for example, a circular, square, or triangular shape. Moreover, for example, a mark or the like may be drawn, or a groove, a notch, or the like may be formed on the XY plane of plate-shaped portion 22f as an indicator of the arrangement position of the all-solid-state battery assembly 10.

The bolt insertion holes 22h are disposed at the outer peripheral edge portion of the XY plane of the plate-shaped portion 22f. In a plan view, the bolt insertion holes 22h are disposed outside the region where the all-solid-state battery assembly 10 is disposed. The bolt insertion holes 22h are respectively provided at four corner portions of the rectangular restraint plates 22a, 22b. In this example, four bolt insertion holes 22h are provided for each of the restraint plates 22a, 22b. However, the number of the bolt insertion holes 22h may be three, or four or more. In a cross-sectional view, the bolt insertion holes 22h penetrate the restraint plates 22a, 22b in the thickness direction Z. A screw groove is formed on the inner wall of the bolt insertion hole 22h of one restraint plate 22a. A shaft portion 24s of a bolt 24 described later is inserted into the bolt insertion hole 22h of the restraint plate 22a, and the bolt 24 is screwed. No screw groove is formed in the bolt insertion hole 22h of the other restraint plate 22b. The shaft portion 24s of the bolt 24 is loosely inserted in the bolt insertion hole 22h of the restraint plate 22b.

The restraint member 23 is attached so as to bridge the pair of restraint plates 22a, 22b. Here, the restraint member 23 includes a plurality of bolts 24, a plurality of washers 26a, 26b, and a plurality of nuts 28. However, the washers 26a, 26b are not essential and can be omitted. The bolt 24, the washers 26a, 26b, and the nut 28 are each typically made of a metal. However, the bolt 24, the washers 26a, 26b, and the nut 28 may be made of an organic material such as a resin or an inorganic material such as a ceramic. The material of the bolt 24, the washers 26a, 26b, and the nut 28 may be the same or different. From the viewpoint of matching the thermal expansion coefficients, the restraint plates 22a, 22b and the restraint member 23 may be made of the same material. For example, the restraint plates 22a, 22b, the bolt 24, and the nut 28 may be made of the same material (for example, the same type of metal material). In the present embodiment, the number of bolts 24 and nuts 28 is four, which is the same as the number of bolt insertion holes 22h of the restraint plates 22a, 22b. Further, in the present embodiment, the number of washers 26a, 26b is eight, which is the same as the total number of bolt insertion holes 22h.

The bolt 24 is provided with the shaft portion 24s and a head portion 24h. The head portion 24h has a shape that is a size larger than the outer shape of the shaft portion 24s of the bolt 24. The head portion 24h does not penetrate the bolt insertion hole 22h of the restraint plate 22a, and protrudes below the restraint plate 22a. The shaft portion 24s extends upward along the thickness direction Z from the head portion 24h. The shaft portion 24s has an outer diameter smaller than the bolt insertion hole 22h of the restraint plate 22b. A screw groove screwed into the bolt insertion hole 22h of the restraint plate 22a is formed on the outer surface of the shaft portion 24s. One restraint plate 22a is screwed with the shaft portion 24s. The other restraint plate 22b is loosely fitted on the shaft portion 24s. The shaft portion 24s protrudes above the restraint plate 22b. A nut 28 is screwed onto the portion of the shaft portion 24s protruding upward. The nut 28 is screwed onto the shaft portion 24s.

The washers 26a, 26b are ring-shaped. The washers 26a, 26b have through holes penetrating in the thickness direction Z. The through holes of the washers 26a, 26b are a size larger than the outer diameter of the bolt 24. The washers 26a, 26b are loosely fitted on the bolt 24. In a cross-sectional view, the washer 26a is disposed between the bolt 24 and the restraint plate 22a. The washer 26a supports the restraint plate 22a. Further, the washer 26b is disposed between the restraint plate 22b and the nut 28. The washer 26b supports the restraint plate 22b.

In the present embodiment, where the smallest thermal expansion coefficient among the thermal expansion coefficient of the positive electrode current collector 12a and the thermal expansion coefficient of the negative electrode current collector 14a of the all-solid-state battery assembly 10 is denoted by $\alpha 1$, the thermal expansion coefficient $\alpha 2$ of the bolt 24 and the thermal expansion coefficient $\alpha 3$ of the nut 28 are each equal to or greater than $\alpha 1$. That is, $\alpha 1$, $\alpha 2$ and $\alpha 3$ satisfy the relationships of $\alpha 1 \leq \alpha 2$ and $\alpha 1 \leq \alpha 3$. The thermal expansion coefficient $\alpha 2$ of the bolt 24 and the thermal expansion coefficient $\alpha 3$ of the nut 28 may be the same or different. As a result, for example, even under a low temperature environment where the all-solid-state battery assembly 10 is frozen, the restraint jig 20 is unlikely to become loose.

As an example, when the positive electrode current collector 12a is made of aluminum (thermal expansion coefficient: $23.9 \times 10^{-6}/°$ C.), and the negative electrode current collector 14a is made of copper (thermal expansion coefficient: $16.5 \times 10^{-6}/°$ C.), al is $16.5 \times 10^{-6}/°$ C. In this case, it is essential that $\alpha 2$ and $\alpha 3$ each be $16.5 \times 10^{-6}/°$ C. or higher. Each of $\alpha 2$ and $\alpha 3$ may be, for example, $17 \times 10^{-6}/°$ C. or more and $20 \times 10^{-6}/°$ C. or more, that is, higher than $\alpha 1$. By setting $\alpha 2$ and $\alpha 3$ to be equal to or higher than the predetermined value, the effects of the art disclosed herein can be exhibited at a higher level. Each of $\alpha 2$ and $\alpha 3$ may be, for example, $50 \times 10^{-6}/°$ C. or less, $30 \times 10^{-6}/°$ C. or less, and $25 \times 10^{-6}/°$ C. or less.

Although not particularly limited, examples of the metal material having a thermal expansion coefficient of $16.5 \times 10^{-6}/°$ C. or higher include Al, Cr, Ni, Cu, Zn, Ag, Sn, alloys thereof, some types of stainless steel and the like. Examples of more specific materials (and thermal expansion coefficients thereof) include pure aluminum ($23.9 \times 10^{-6}/°$ C.) and aluminum alloys such as duralumin ($27.3 \times 10^{-6}/°$ C.), aluminum bronze (for example, 5 Al; $16.5 \times 10^{-6}/°$ C.) and the like; silver ($19.7 \times 10^{-6}/°$ C.); nickel alloys such as nickel steel (for example, 20 Ni; $18 \times 10^{-6}/°$ C.), chromium nickel steel (for example, 18 Cr, 8 Ni; $16.7 \times 10^{-6}/°$ C.) and the like; gunmetal (for example, 10 Sn, 2 Zn; $18 \times 10^{-6}/°$ C.); copper ($16.5 \times 10^{-6}/°$ C.) and the like. Further, examples of stainless steel (and thermal expansion coefficient thereof) include Fe-, Cr- and Ni-containing austenitic stainless steels of 300 series, such as SUS301 ($16.9 \times 10^{-6}/°$ C.), SUS304 ($17.3 \times 10^{-6}/°$ C.), SUS316 ($16.0 \times 10^{-6}/°$ C.), SUS316L ($16.0 \times 10^{-6}/°$ C.), SUS321 ($16.7 \times 10^{-6}/°$ C.), SUS347 ($16.7 \times 10^{-6}/°$ C.) and the like.

As another example, when both the positive electrode current collector 12a and the negative electrode current collector 14a are made of stainless steel (thermal expansion coefficient: $17.3 \times 10^{-6}/°$ C.), $\alpha 1$ is $17.3 \times 10^{-6}/°$ C. In this case, it is essential that $\alpha 2$ and $\alpha 3$ each be $17.3 \times 10^{-6}/°$ C. or higher. Each of $\alpha 2$ and $\alpha 3$ may be, for example, $18 \times 10^{-6}/°$ C. or more and $20 \times 10^{-6}/°$ C. or more, that is, higher than $\alpha 1$. Each of $\alpha 2$ and $\alpha 3$ may be, for example, $50 \times 10^{-6}/°$ C. or less, $30 \times 10^{-6}/°$ C. or less, and $25 \times 10^{-6}/°$ C. or less.

The thermal expansion coefficient of the members other than the bolt 24 and the nut 28 of the restraint member 23, for example, the restraint plates 22a, 22b and the washers 26a, 26b, is not particularly limited. For example, the thermal expansion coefficient $\alpha 4$ of the restraint plates 22a, 22b may be the same as the thermal expansion coefficient $\alpha 2$ of the bolt 24, or maybe $\alpha 4 \geq \alpha 2$, or $\alpha 4 \leq \alpha 2$. Further, it is also possible that $\alpha 4 \geq \alpha 1$ or $\alpha 4 \leq \alpha 1$. Where $\alpha 4 \leq \alpha 2$ and/or $\alpha 4 \leq \alpha 1$, the force acting on the pressure reduction side at the time of cooling is reduced, and the art disclosed herein can be exhibited at a higher level. Further, for example, the thermal expansion coefficient $\alpha 5$ of the washers 26a, 26b may be the same as the thermal expansion coefficient $\alpha 2$ of the bolt 24, or maybe $\alpha 5 \geq \alpha 2$ or $\alpha 5 \leq \alpha 2$. It is also possible that $\alpha 5 \geq \alpha 1$ or $\alpha 5 \leq \alpha 1$.

Short Circuit Inspection Method

Figure 4:
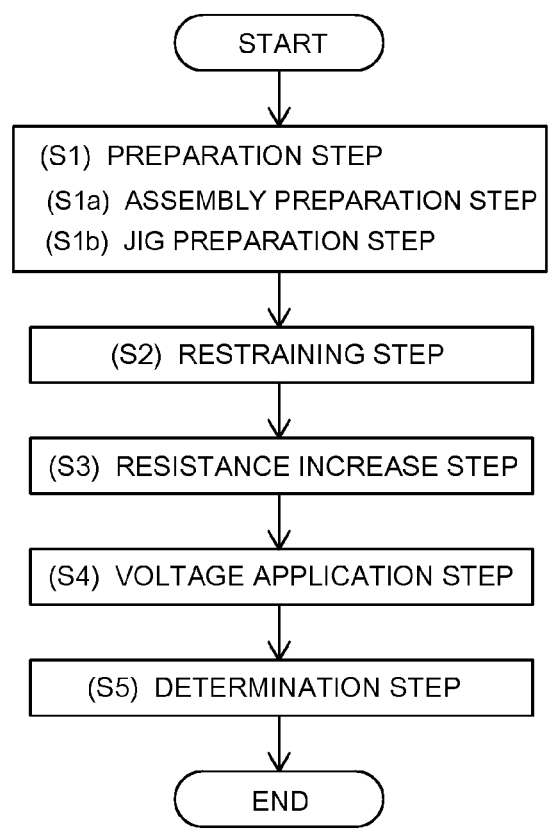
FIG. 4 is a flowchart of a short circuit inspection method according to one embodiment.

Next, the short circuit inspection method of the present embodiment will be described. In the short circuit inspection method of the present embodiment, the short circuit inspection of the all-solid-state battery assembly 10 is performed using the restraint jig 20. FIG. 4 is a flowchart of the short circuit inspection method according to one embodiment. The short circuit inspection method according to the present embodiment includes a preparation step (step S1), a restraining step (step S2), a resistance increase step (step S3), a voltage application step (step S4), and a determination step (step S5). However, the inclusion of other steps at any stage is not prohibited. Hereinafter, the steps will be described in order.

The preparation step (step S1) includes an assembly preparation step (step S1a) and a jig preparation step (step S1b). In the assembly preparation step (step S1a), the all-solid-state battery assembly 10 is prepared. The all-solid-state battery assembly 10 may be a commercially available product or may be fabricated by a conventionally known manufacturing method. Further, in the jig preparation step (step S1b), the restraint jig 20 for restraining the all-solid-state battery assembly 10 is prepared. The restraint jig 20 may be in a pre-assembled state or in a partially assembled state. In this step, the kit 30 for short circuit inspection including the restraint jig 20 and the container 32 may also be prepared.

In the restraining step (step S2), first, the restraint plate 22a of the restraint jig 20, the washers 26a, and the bolts 24 are pre-assembled. That is, the shaft portions 24s of the bolts 24 are inserted into the four bolt insertion holes 22h of the restraint plate 22a from the lower side of the restraint plate 22a. At this time, the washer 26a is inserted between the shaft portion 24s and the head portion 24h of each bolt 24. The shaft portion 24s of each bolt 24 moves upward along the screw groove of the bolt insertion hole 22h of the restraint plate 22a. The bolt 24 is locked by the head portion 24h to the peripheral portion of the bolt insertion hole 22h of the restraint plate 22a. Thus, the washer 26a and the bolt 24 are fixed to the restraint plate 22a, and these are integrated.

Next, the all-solid-state battery assembly 10 is disposed on the plate-shaped portion 22f of the pre-assembled restraint plate 22a. At this time, as shown in FIG. 2, the all-solid-state battery assembly 10 may be disposed such that the center of the XY plane of the restraint plate 22a coincides with the center of the XY plane of the all-solid-state battery assembly 10. Further, as shown in FIG. 3, the all-solid-state battery assembly 10 may be disposed such that the center of the restraint plate 22a and the center of the all-solid-state battery assembly 10 are aligned in the thickness direction Z in a cross-sectional view.

Next, another restraint plate 22b is put from above on the all-solid-state battery assembly 10, and the shaft portions 24s of the bolts 24 are inserted into the bolt insertion holes 22h of the restraint plate 22b. Thus, the all-solid-state battery assembly 10 is sandwiched by the restraint plates 26a, 26b in the thickness direction Z. The shaft portions 24s protrude above the restraint plate 22b. Next, the nuts 28 are screwed onto the portions of the shaft portions 24s that protrude upward from the restraint plate 22b, with the washers 26b being interposed therebetween. As a result, each nut 28 is locked to the peripheral portion of the bolt insertion hole 22h. As the nuts 28 are tightened from this state, the restraining load increases accordingly. The restraining load may be approximately 1 MPa to 100 MPa, for example, 2 MPa to 20 MPa. In this manner, the all-solid-state battery assembly 10 is restrained with a predetermined load by the restraint plates 26a, 26b and the restraint member 23. In other words, the thickness of the all-solid-state battery assembly 10 and the restraint plates 22a, 22b is fixed by the restraint member 23.

In the resistance increase step (step S3), first, one of the voltage terminals of a commercially available charging/discharging device is electrically connected to the positive electrode terminal 12t of the positive electrode 12, and another voltage terminal is electrically connected to the negative electrode terminal 14t of the negative electrode 14 as preparation for the voltage application step (step S4) described hereinbelow. Similarly, one of the current terminals is electrically connected to the positive electrode 12, and the other current terminal is electrically connected to the negative electrode 14.

Next, the restrained all-solid-state battery assembly 10 is cooled. As a result, the all-solid-state battery assembly 10 is brought into a low-temperature state and is unlikely to function as a battery. That is, the resistance of the all-solid-state battery assembly 10 is increased to suppress the electrochemical reaction that occurs inside the all-solid-state battery assembly 10. A method of cooling the all-solid-state battery assembly 10 may be exemplified by a method of filling the accommodation space 32s of the container 32 with a liquid refrigerant and immersing the all-solid-state battery assembly 10 therein. The liquid refrigerant (and the boiling point thereof at atmospheric pressure) can be exemplified by liquid helium (−269° C.), liquid nitrogen (−196° C.), liquid oxygen (−183° C.), a freezing agent (for example, a mixture of dry ice with an alcohol (−72° C.)) and the like. As a result, the all-solid-state battery assembly 10 can be cooled rapidly. Other examples include a method of bringing the all-solid-state battery assembly 10 into contact with a solid refrigerant (for example, dry ice), a method of disposing the all-solid-state battery assembly 10 in a low-temperature thermostatic chamber (chamber), and the like.

The cooling temperature of the all-solid-state battery assembly 10 may be adjusted, as appropriate, according to, for example, the accuracy required for inspection, the configuration of the all-solid-state battery assembly 10, and the like. Although not particularly limited, the cooling temperature of the all-solid-state battery assembly 10 is, for example, −45° C. or less, −90° C. or less, −100° C. or less, −120° C. or less, −140° C. or less, −150° C. or less and −300° C. or more and −200° C. or more. The cooling process increases the resistance of the all-solid-state battery assembly 10 to a level at which the assembly is unlikely to function as a battery. From the viewpoint of performing inspection with higher accuracy, the resistance value of the all-solid-state battery assembly 10 may be increased to approximately $1 \times 10^6 \Omega$ or more, typically $1 \times 10^7 \Omega$ or more, for example $1 \times 10^8 \Omega$ or more. In addition, when such a cooling process is performed on the battery assembly of a liquid system, the volume change at the time of cooling is large, and the battery assembly is likely to be greatly damaged. Meanwhile, in the all-solid-state battery assembly 10, the volume change at the time of cooling is relatively small. For this reason, the influence of cooling can be suppressed.

In the voltage application step (step S4), a voltage is applied to the all-solid-state battery assembly 10 in a high-resistance state. In one example, first, a voltage is applied by the charging/discharging device to the all-solid-state battery assembly 10 restrained in a cooled state. Next, the current value at the time the voltage is applied is measured. In one embodiment, this step is performed while maintaining the cooled state of the all-solid-state battery assembly 10 in the above-described resistance increase step (step S3). For example, this step is performed in a state in which the all-solid-state battery assembly 10 is immersed in a liquid refrigerant. For example, this step is performed in a state in which the temperature change of the all-solid-state battery assembly 10 is suppressed to within ±5° C., and preferably to within ±1° C. As a result, the cooled state of the all-solid-state battery assembly 10 can be stably maintained, and the inspection with less error can be performed.

The applied voltage may be adjusted, as appropriate, according to, for example, the accuracy required for inspection, the configuration of the all-solid-state battery assembly 10, and the like. Although not particularly limited, the applied voltage may be, for example, 1 V or more, 2 V or more, 100 V or more, 200 V or more, and 1000 V or less and 500 V or less. By setting the applied voltage to a predetermined value or less, damage to the all-solid-state battery assembly 10 can be minimized. The applied voltage may be adjusted so that the current value measured in the determination step (step S5) described hereinbelow is approximately 5 mA or less, for example, 2 mA or less. Further, by setting the applied voltage to a predetermined value or more, the measured current value becomes large. Therefore, even a very small short circuit can be detected with high accuracy.

In the determination step (step S5), it is determined whether or not a short circuit has occurred in the all-solid-state battery assembly 10 on the basis of the current value measured in the voltage application step. That is, when the internal short circuit has occurred in the all-solid-state battery assembly 10, the current value measured in the voltage application step is larger than that when the internal short circuit has not occurred in the all-solid-state battery assembly 10. Therefore, the presence or absence of the internal short circuit can be detected based on the current value. In one example, first, a threshold is set by the absolute value of the current. For example, when the applied voltage is 200 V, the current value serving as the threshold may be 0.9 mA or more and 1 mA or more. Next, the current value measured in the voltage application step is compared with the threshold. Then, for example, when the measured current value has reached the threshold, it is determined that the all-solid-state battery assembly 10 is "with an internal short circuit". That is, it is determined that the all-solid-state battery assembly 10 is a reject. Meanwhile, when the measured current value has not reached the threshold, it is determined that the all-solid-state battery assembly 10 is "without an internal short circuit" or that "the degree of the internal short circuit is within the allowable range". That is, the all-solid-state battery assembly 10 is determined to be an accepted product.

In another example, first, a reference value for determining the presence or absence of an internal short circuit is set. As a reference value, an arithmetic mean value, a median value (median) or the like of current values of a plurality of all-solid-state battery assemblies 10 can be used. Then, for example, assuming that the measured current value is IA and the reference value is IB, when the ratio of IA to IB (IA/IB) has reached a predetermined threshold, it is determined that the all-solid-state battery assembly 10 is "with an internal short circuit". That is, it is determined that the all-solid-state battery assembly 10 is a reject. Meanwhile, when the IA/IB ratio has not reached the threshold, it is determined that the all-solid-state battery assembly 10 is "without an internal short circuit" or that "the degree of the internal short circuit is within the allowable range". That is, the all-solid-state battery assembly 10 is determined to be an accepted product. As the threshold of the ratio (IA/IB), for example, a value corresponding to about $2\sigma$ to $4\sigma$ ($\sigma$ means a standard deviation) can be set.

According to the inspection method including steps S1 to S5 such as described above, the short circuit inspection can be performed a relatively simple method of applying a voltage in a state where all-solid-state battery assembly 10 is restrained and cooled, and measuring the current value. In particular, as a result of using the restraint jig 20 disclosed herein, the restraining force on the all-solid-state battery assembly 10 is stably maintained even in a low-temperature environment where the all-solid-state battery assembly 10 is frozen. By this, the short circuit inspection of the all-solid-state battery assembly 10 can be performed with high sensitivity.

Method for Manufacturing All-Solid-State Battery

The manufacturing method of the present embodiment includes the short circuit inspection method of the all-solid-state battery assembly 10 described above. That is, in the manufacturing process, batteries determined to be "with an internal short circuit" in the short circuit inspection are removed. Alternatively, only the batteries determined to be accepted products are transferred to the next step. This makes it possible to manufacture all-solid-state batteries with further improved quality stability and to supply such batteries to the market.

Method for Manufacturing Battery Pack

In the manufacturing method of the present embodiment, a battery pack in which a plurality of all-solid-state batteries is combined in series or in parallel is manufactured. The battery pack can be suitably used particularly in applications where high energy density and high power density are required. In the battery pack, where the spread among the all-solid-state batteries is large, sufficient performance may not be exhibited. Therefore, it is preferable to use the manufacturing method disclosed herein at the time of manufacture of the all-solid-state battery to be used, for example, as a motive power source (driving power supply) for a motor mounted on a vehicle.

The manufacturing method of the present embodiment includes the short circuit inspection method of the all-solid-state battery assembly 10 described above. The manufacturing method includes, for example, an inspection step of inspecting the all-solid-state battery assemblies 10, and a construction step of constructing a battery pack using the all-solid-state battery assemblies 10 determined to be accepted products in the inspection step. In the inspection step, the battery determined to be "with an internal short circuit" can be appropriately removed. Furthermore, batteries of uniform quality can be selected from among the plurality of all-solid-state battery assemblies 10. As a result, the battery pack manufactured by the manufacturing method of the present embodiment can exhibit characteristics superior to the conventional ones, for example, high energy density and cycle characteristic (durability).

Several examples of the art disclosed herein are described hereinbelow, but the art disclosed herein is not intended to be limited to those specific examples.

TEXT EXAMPLES

Preparation of Positive Electrode

First, a positive electrode slurry including lithium cobalt oxide as a positive electrode active material, a sulfide material (a mixture of $Li_2S:P_2S_5=70:30$ (mass ratio)) as a solid electrolyte material, and polyvinylidene fluoride (PVdF) as a binder was prepared. Next, this positive electrode slurry was applied to the surface of an aluminum foil (thermal expansion coefficient: $23.9 \times 10^{-6}/°$ C.) as a positive electrode current collector and dried. A positive electrode having a positive electrode composite material layer on the positive electrode current collector was thus obtained.

Preparation of Negative Electrode

First, a negative electrode slurry including graphite as a negative electrode active material, a sulfide material (a mixture of $Li_2S:P_2S_5=70:30$ (mass ratio)) as a solid electrolyte material, and polyvinylidene fluoride (PVdF) as a binder was prepared. Next, this negative electrode slurry was applied to the surface of a copper foil (thermal expansion coefficient: $16.5 \times 10^{-6}/°$ C.) as a negative electrode current collector and dried. A negative electrode having a negative electrode composite material layer on the negative electrode current collector was thus obtained.

Preparation of Solid Electrolyte Layer

An electrolyte slurry including a sulfide material (a mixture of $Li_2S:P_2S_5=70:30$ (mass ratio)) as a solid electrolyte material and butadiene rubber (BR) as a binder was prepared. Next, this electrolyte slurry was applied to the surface of a substrate (release sheet) and dried. A transfer sheet having a solid electrolyte layer (average thickness 30 μm) on the release sheet was thus obtained.

Preparation of All-Solid-State Battery Assembly

First, the negative electrode and the transfer sheet were laminated such that the surface on the negative electrode composite material layer side and the surface on the solid electrolyte layer were in contact with each other, and a pressure of 100 MPa was applied from the lamination direction. The solid electrolyte layer was thus transferred to the surface of the negative electrode. The release sheet of the transfer sheet was then peeled off. Next, the positive electrode was laminated such that the solid electrolyte layer and the positive electrode composite material layer were in contact with each other, and a pressure of 600 MPa was applied from the lamination direction. An electrode assembly in which the positive electrode, the solid electrolyte layer, and the negative electrode were stacked in this order was thus obtained. The electrode assembly was housed in a battery case made of an aluminum laminate, and a plurality of all-solid-state battery assemblies (without foreign matter) were thus prepared.

Figure 5:
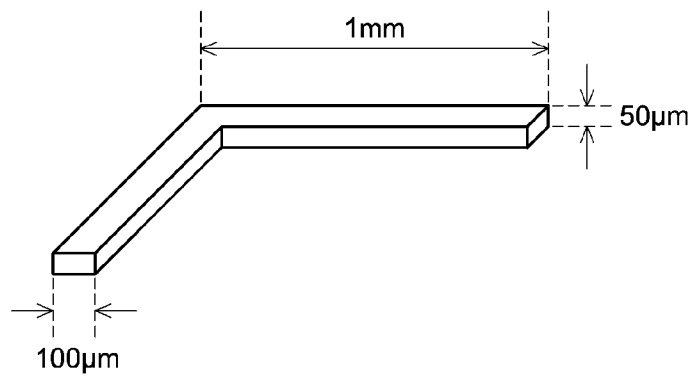
FIG. 5 is a perspective view showing a simulated conductive foreign matter used for evaluation.

FIG. 5 is a perspective view showing a simulated conductive foreign matter. The conductive foreign matter has an L-like outer shape and is made of SUS 304. A plurality of all-solid-state battery assemblies (with foreign matter) was prepared in the same manner as in the case without the foreign matter except that the conductive foreign matter was inserted (intentionally included) between the solid electrolyte layer and the positive electrode composite material layer.

Restraining Step

Next, the all-solid-state battery assembly (without foreign matter/with foreign matter) was restrained with the restraint jig as shown in FIGS. 2 and 3. Specifically, first, the all-solid-state battery assembly was disposed between a pair of restraint plates of the restraint jig. At this time, the materials of the restraint plates, the bolts, the washers and the nuts of the restraint jig are the same as shown in Table 1. That is, the restraint jigs made of aluminum in Example 1, copper in Example 2, SUS304 in Example 3 and iron in Example 4 were used. The thickness of the restraint plate was 20 mm. Then, the restraint plates and the all-solid-state battery assembly were restrained in the thickness direction by the restraint member. In all the examples, the restraining load was 10 MPa. Further, in all the examples, $\alpha 1$ is the thermal expansion coefficient ($16.5 \times 10^{-6}/°$ C.) of the negative electrode current collector.

Resistance Increase Step

Next, a thermocouple was attached to the surface of the all-solid-state battery assembly in a restrained state, and then the restraint jig and the all-solid-state battery assembly were allowed to stand in a Styrofoam container. Next, liquid nitrogen was injected into the container to completely immerse the all-solid-state battery assembly. When the amount of liquid nitrogen decreased, additional injection was performed as appropriate. The temperature of the all-solid-state battery assembly was thus lowered to −150° C. or less to cool the all-solid-state battery assembly.

Voltage Application Step

Next, a charging/discharging device was connected to the positive electrode terminal and the negative electrode terminal of the restrained and cooled all-solid-state battery assembly, and a voltage of 200 V was applied. The current value at this time was then measured. The results are shown in Table 1.

TABLE 1

| Example | Current collector — Thermal expansion coefficient $\alpha 1$ | Restraint jig* — Material Thermal expansion coefficients $\alpha 2, \alpha 3$ | Current value (mA) Without foreign matter, In | Current value (mA) With foreign matter, Ie | Ratio Ie/In | Foreign matter detection sensitivity |
|---|---|---|---|---|---|---|
| 1 | 16.5 ($\times 10^{-6}/°$ C.) | Aluminum 23.9($\times 10^{-6}/°$ C.) | 0.81 | 1.60 | 2.0 | High |
| 2 | | Copper 16.5($\times 10^{-6}/°$ C.) | 0.65 | 1.08 | 1.7 | High |
| 3 | | SUS304 17.3($\times 10^{-6}/°$ C.) | 0.72 | 1.21 | 1.7 | High |
| 4 | | Iron 12($\times 10^{-6}/°$ C.) | 0.25 | 0.30 | 1.2 | Low |

*Restraint plates, bolts, washers, and nuts

As shown in Table 1, in Example 4, the value of Ie/In (that is, the difference between the current value with and without foreign matter) was small, and the presence or absence of a short circuit (including a defect that causes it) could not be accurately detected. Meanwhile, in Examples 1 to 3, the presence or absence of a short circuit could be detected with high accuracy. The inventors of the present invention consider that the reason therefor is that the materials of the restraint jig satisfy the following condition: the thermal expansion coefficient $\alpha 2$ of the bolt and the thermal expansion coefficient $\alpha 3$ of the nut are each equal to or greater than the smallest thermal expansion coefficient $\alpha 1$ (here, the thermal expansion coefficient of the negative electrode current collector (copper)) among the thermal expansion coefficient of the positive electrode current collector and the thermal expansion coefficient of the negative electrode current collector, thereby making it possible to restrain the all-solid-state battery assembly stably even under low-temperature environment such that causes the all-solid-state battery assembly to freeze, which results in improved detection sensitivity. Such a result shows the significance of the art disclosed herein.

Although it is not necessary to clarify the mechanism by which the restraining force is weakened when the thermal expansion coefficient of the restraint jig is large, the inventors of the present invention offer the following explanation. That is, in the present inspection method, the bolt and the nut are used to fix the thickness between the all-solid-state battery assembly and the restraint plates. For example, assuming that the thickness of the all-solid-state battery assembly is 1 cm and the thickness of one restraint plate is 1 cm, the distance between the washers in the restraining step is fixed to 3 cm (the sum of 1 cm, which is the thickness of the all-solid-state battery assembly, plus 2 cm which is the thickness of two restraint plates).

When the all-solid-state battery assembly and the restraint plates are cooled to a low temperature in a state where the distance between the washers is fixed, the all-solid-state battery assembly and the restraint plates undergo low-temperature shrinkage, and the thickness decreases. At this time, the degree of low-temperature shrinkage of the all-solid-state battery assembly is larger as the thermal expansion coefficient is larger. Further, the degree of low-temperature shrinkage of the all-solid-state battery assembly can be influenced by the thermal expansion coefficient of the current collector. As the thickness of the all-solid-state battery assembly and the restraint plates decreases, the total thickness of the all-solid-state battery assembly and the restraint plates becomes less than 3 cm. Therefore, the action is to "depressurize" the all-solid-state battery assembly and the restraint plates. Meanwhile, when the restraint member (bolts and nuts) is cooled to a low temperature, the bolts undergo low-temperature shrinkage, and the distance between the washers decreases. As a result, the thickness of the space in which the all-solid-state battery assembly and the restraint plates are disposed becomes less than 3 cm. Therefore, the action is to "pressurize" the all-solid-state battery assembly and the restraint plates.

In Table 2, the inventors of the present invention summarize the change in thickness under the low-temperature environment. In Table 2, the "pressurization shrinkage amount" represents the amount of change in the distance between the washers in the thickness direction, and the "depressurization shrinkage amount" represents the total amount of change of the all-solid-state battery assembly and the restraint plates in the thickness direction.

TABLE 2

| Restraint jig* Material | Under low-temperature environment | | |
|---|---|---|---|
| Thermal expansion coefficients $\alpha 2, \alpha 3$ | (Pressurization shrinkage amount) minus (Depressurization shrinkage amount) | | Restraining load |
| | Plate thickness 10 mm | Plate thickness 20 mm | |
| Aluminum 23.9($\times 10^{-6}$/° C.) | 0.010226 mm | 0.010226 mm | Increases |
| SUS304 17.3($\times 10^{-6}$/° C.) | 0.003921 mm | 0.003921 mm | Increases |
| Copper 16.5($\times 10^{-6}$/° C.) | 0.003436 mm | 0.003436 mm | Increases |
| Iron 12($\times 10^{-6}$/° C.) | −0.00122 mm | −0.00122 mm | Comes out |

*Restraint plates, bolts, washers, and nuts

Figure 6:
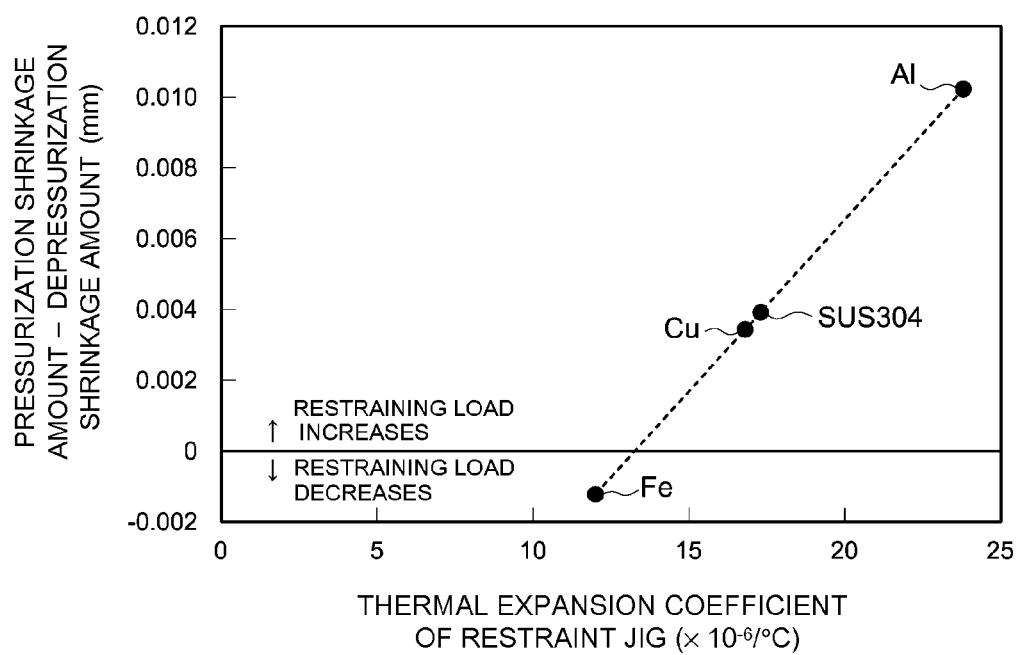
FIG. 6 is a graph showing the relationship between the thermal expansion coefficient of the restraint jig and the thickness change under a low temperature environment.

FIG. 6 is a graph showing the relationship between the thermal expansion coefficients of the restraint jigs in Table 2 and the change in thickness (pressurization shrinkage amount—depressurization shrinkage amount) under a low-temperature environment. As shown in Table 2 and FIG. 6, when the amount of change (depressurization shrinkage amount) in which the restraining force is weakened is large, it is understood that the restraining force as a whole is weakened in a low temperature environment. Meanwhile, when the amount of change (pressurization shrinkage amount) in which the restraining force is strengthened is large, it is understood that the restraining force as a whole is increased in a low temperature environment.

In addition, as shown in Table 2, from the comparison of the results obtained when using the restraint plates with a thickness of 10 mm with the results obtained when using the restraint plates with a thickness of 20 mm, it can be seen that even when the thickness of the restraint plates is reduced to suppress the absolute shrinkage amount of the restraint plates, the distance between the washers is correspondingly reduced, so that the relationship of changes in the overall restraining force does not change. That is, even when the thickness of the restraint plates is changed, the tendency to weaken the restraining force as a whole is the same.

Although the art disclosed herein has been described in detail, the above embodiments and examples are merely illustrative, and the present invention is also inclusive of various modifications and alterations of the specific examples described above.

The terms and expressions used herein are for description only and are not to be interpreted in a limited sense. These terms and expressions should be recognized as not excluding any equivalents to the elements shown and described herein and as allowing any modification encompassed in the scope of the claims. The preferred embodiments disclosed herein may be embodied in many various forms. This disclosure should be regarded as providing preferred embodiments of the principle of the invention. These preferred embodiments are provided with the understanding that they are not intended to limit the invention to the preferred embodiments described in the specification and/or shown in the drawings. The invention is not limited to the preferred embodiment described herein. The invention disclosed herein encompasses any of preferred embodiments including equivalent elements, modifications, deletions, combinations, improvements and/or alterations which can be recognized by a person of ordinary skill in the art based on the disclosure. The elements of each claim should be interpreted broadly based on the terms used in the claim, and should not be limited to any of the preferred embodiments described in this specification or used during the prosecution of the present application.

What is claimed is:

1. A short circuit inspection method for an all-solid-battery assembly comprising:
   an assembly preparation step of preparing the all-solid-state battery assembly including a positive electrode including a positive electrode current collector and a positive electrode composite material layer disposed on the positive electrode current collector, a negative electrode including a negative electrode current collector and a negative electrode composite material layer disposed on the negative electrode current collector, and a solid electrolyte layer interposed between the positive electrode composite material layer and the negative electrode composite material layer in a thickness direction;
   a jig preparation step of preparing a restraint jig including a pair of restraint plates having a bolt insertion hole and sandwiching the all-solid-state battery assembly in the thickness direction, and a restraint member that includes a bolt to be inserted into the bolt insertion hole and a nut to be screwed to the bolt and applies a load to the all-solid-state battery assembly from the thickness direction, wherein when a smallest thermal expansion coefficient among a thermal expansion coefficient of the positive electrode current collector and a thermal expansion coefficient of the negative electrode current collector of the all-solid-state battery assembly is denoted by $\alpha 1$, the thermal expansion coefficients of the bolt and the nut are each equal to or greater than $\alpha 1$;

a restraining step of disposing the all-solid-state battery assembly between the pair of restraint plates of the restraint jig and restraining the all-solid-state battery assembly with the restraint jig;

a resistance increase step of increasing the resistance of the all-solid-state battery assembly by cooling the all-solid-state battery assembly after the restraining step;

a voltage application step of applying a voltage to the all-solid-state battery assembly after the resistance increase step and measuring a current value at a time of voltage application; and a determination step of determining whether or not a short circuit has occurred in the all-solid-state battery assembly by comparing the measured current value with a predetermined threshold after the voltage application step.

2. The short circuit inspection method according to claim 1, wherein
the restraint plates, the bolt, and the nut are configured of the same type of metal material.

3. The short circuit inspection method according to claim 1, wherein
at least a part of the restraint jig is brought into contact with a refrigerant from the resistance increase step to the voltage application step to maintain the all-solid-state battery assembly in a cooled state.

4. The short circuit inspection method according to claim 1, wherein
in the jig preparation step, the restraint jig in which the thermal expansion coefficients of the bolt and the nut are each $16.5 \times 10^{-6}/°$ C. or more is prepared.

5. A method for manufacturing an all-solid-state battery, comprising the
short circuit inspection method according to claim 1.

* * * * *